(12) United States Patent
Kim

(10) Patent No.: US 7,821,847 B2
(45) Date of Patent: Oct. 26, 2010

(54) CIRCUIT AND METHOD FOR CONTROLLING SLEW RATE OF DATA OUTPUT CIRCUIT IN SEMICONDUCTOR MEMORY DEVICE

(75) Inventor: Mi-Hye Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 108 days.

(21) Appl. No.: 12/345,248

(22) Filed: Dec. 29, 2008

(65) Prior Publication Data

US 2010/0002529 A1  Jan. 7, 2010

(30) Foreign Application Priority Data

Jul. 7, 2008  (KR) .................. 10-2008-0065706

(51) Int. Cl.
*G11C 7/10* (2006.01)
(52) U.S. Cl. .................... 365/189.05; 365/185.23; 365/230.06; 365/191
(58) Field of Classification Search ............ 365/185.23, 365/189.05, 189.07, 230.06, 191
See application file for complete search history.

(56) References Cited

U.S. PATENT DOCUMENTS

| 2007/0042722 | A1* | 2/2007 | Kim ............................ 455/73 |
| 2007/0205811 | A1* | 9/2007 | Nguyen ...................... 327/108 |
| 2008/0278208 | A1* | 11/2008 | Jung .......................... 327/170 |
| 2008/0284464 | A1* | 11/2008 | Bucossi et al. ................ 326/26 |

FOREIGN PATENT DOCUMENTS

| KR | 1020000003736 A | 1/2000 |
| KR | 1020060075398 A | 7/2006 |

OTHER PUBLICATIONS

Notice of Allowance issued from Korean Intellectual Property Office on Jul. 29, 2009 with an English Translation.

* cited by examiner

*Primary Examiner*—Hoai V Ho
*Assistant Examiner*—Anthan T Tran
(74) *Attorney, Agent, or Firm*—IP & T Law Firm PLC

(57) ABSTRACT

A data output circuit of a semiconductor memory device includes at least two data output pads disposed adjacent to each other, a driver unit configured to output a first data by driving a first pad among the data output pads, and a control unit configured to determine whether a phase of the first data is equal to a phase of adjacent data outputted through second pad adjacent to the first pad, and control a slew rate of the driver unit according to the determination result.

22 Claims, 9 Drawing Sheets

CIRCUIT AND METHOD FOR CONTROLLING SLEW RATE OF DATA OUTPUT CIRCUIT IN SEMICONDUCTOR MEMORY DEVICE

CROSS-REFERENCE TO RELATED APPLICATIONS

The present invention claims priority of Korean patent application number(s) 10-2008-0065706, filed on Jul. 7, 2008, which is incorporated by reference in its entirety.

BACKGROUND OF THE INVENTION

The present invention relates to a data output circuit of a semiconductor memory device, and more particularly, to a data output circuit and method for improving a slew rate of an output data signal in a semiconductor memory device.

In general, a semiconductor memory device can be divided into a core region for processing data and a data input/output region for exchanging data with an external device. The data input/output region has a data input buffer and a data output circuit. The data input buffer buffers data received from the outside before transmitting the data to the core region. The data output circuit receives data from the core region, and pull-up or pull-down drives an output terminal so that the received data can be accurately transmitted to other external devices.

Meanwhile, a slew rate representing a voltage/time slope is an example of a measure that indicates how quickly the voltage level of the output data of the data output circuit changes. The slew rate may be influenced by a semiconductor fabrication process and an operating temperature. The slew rate may also be influenced by the structure of a data output terminal. To be specific, since pads of the data output terminal are disposed adjacent to each other, data outputted through the pad may be affected by data outputted through the other adjacent pads.

What is therefore required is to compensate the slew rate of the data output circuit in consideration of the influence of the adjacent output data that is exerted on the output data because the pads of the data output terminal of the semiconductor memory device are disposed adjacent to each other.

SUMMARY OF THE INVENTION

Exemplary embodiments of the present invention are directed to provide a circuit and method for compensating a slew rate of a data output circuit for a loss caused because pads of a data output terminal of a semiconductor memory device are disposed adjacent to each other.

In accordance with an aspect of the present invention, there is provided a data output circuit of a semiconductor memory device, which includes at least two data output pads disposed adjacent to each other, a driver unit configured to output a first data by driving a first pad among the data output pads, and a control unit configured to determine whether a phase of the first data is equal to a phase of adjacent data outputted through second pad adjacent to the first pad, and control a slew rate of the driver unit according to the determination result.

In accordance with another aspect of the present invention, there is provided a data output circuit of a semiconductor memory device, which includes at least two data output pads disposed adjacent to each other, a data trigger unit triggered in response to first data, which is to be outputted through a first pad among the data output pads, to output a pull-up control signal or a pull-down control signal, a first pre-driver configured to output a first data output signal in response to the pull-up control signal, a second pre-driver configured to output a second data output signal in response to the pull-down control signal, a first output driver configured to pull-up drive the first pad in response to the first data output signal, a second output driver configured to pull-down drive the first pad in response to the second data output signal, and a control unit configured to determine whether the phase of the first data is equal to the phase of adjacent data outputted through second pad adjacent to the first pad, and control a slew rate of the drivers according to the determination result.

In accordance with further aspect of the present invention, there is provided a method for controlling a data output circuit of a semiconductor memory device including at least two data output pads disposed adjacent to each other, the method including determining whether the phase of the first data outputted through a first pad among the data output pads is equal to the phase of adjacent data outputted through pads adjacent to the first pad, and controlling a slew rate of a driver unit, which output the first data by driving the first pad, according to the determination result.

DESCRIPTION OF SPECIFIC EMBODIMENTS

Other objects and advantages of the present invention can be understood by the following description, and become apparent with reference to the embodiments of the present invention.

Figure 1:
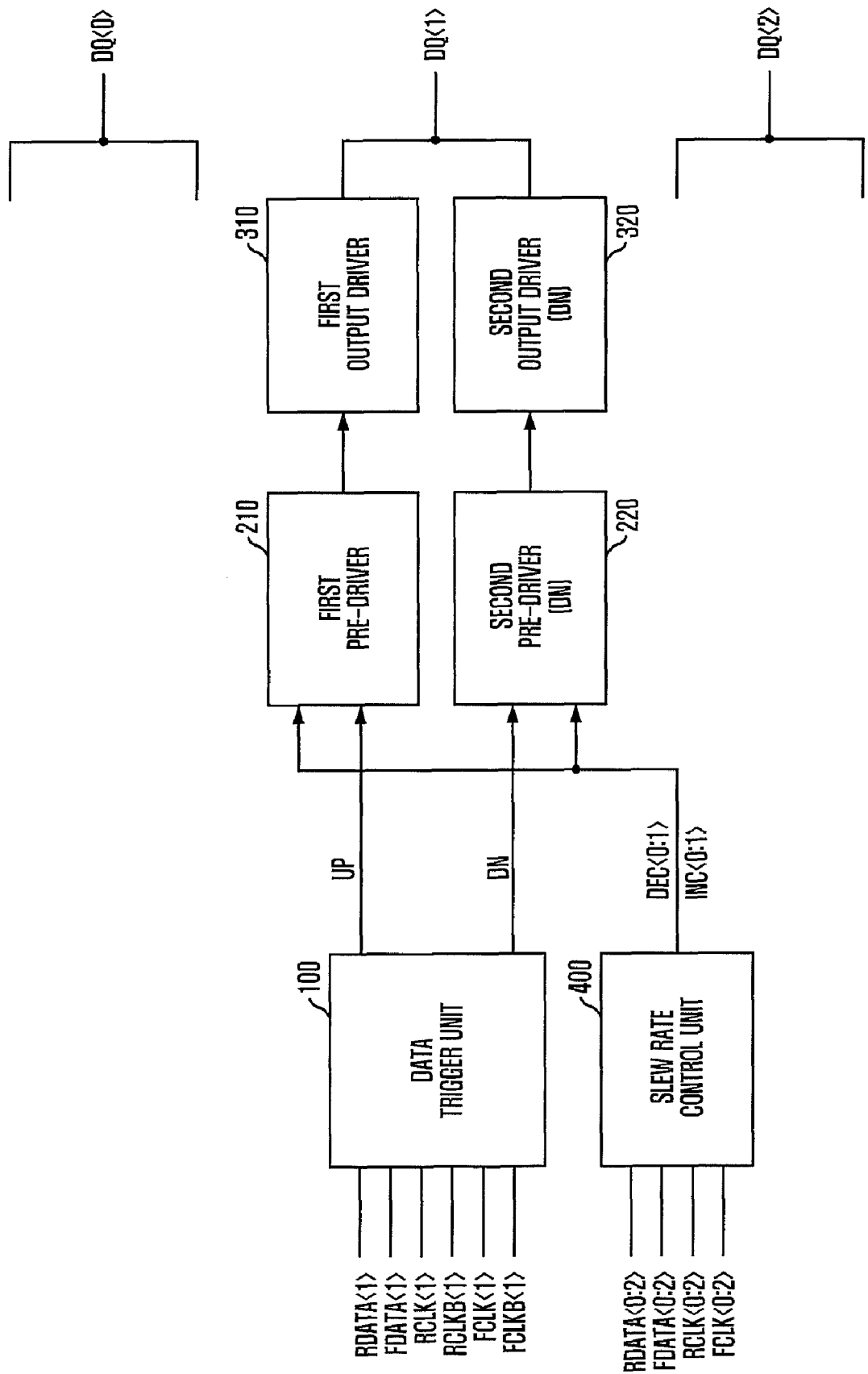
FIG. 1 is a block diagram of a data output circuit of a semiconductor memory device in accordance with an exemplary embodiment of the present invention.

FIG. 1 is a block diagram of a data output circuit of a semiconductor memory device in accordance with an exemplary embodiment of the present invention. Although the block diagram of FIG. 1 illustrates a data output circuit of a double data rate (DDR) dynamic random access memory (DRAM) device, the technical concept of this embodiment can also be similarly applied to any semiconductor memory device including a data output circuit.

As shown, the data output circuit includes at least two data output pads and a driver unit. The data output pads are disposed adjacent to each other, and the driver unit drives the data output pads to output input data. Herein, it is exemplified that the data output pads include pads DQ<0>, DQ<1> and DQ<2> for outputting three data. The driver unit includes a data trigger unit 110, pre-drivers 210 and 220, and output drivers 310 and 320 to output data through the data output pad DQ<1>. Although not illustrated in the drawings, driver units for outputting data through the data output pads DQ<0> and DQ<2> may be configured in the same way as the above driver unit.

The data trigger unit 110 is triggered in response to input data to output a pull-up control signal UP or a pull-down control signal DN. The first pre-driver 210 outputs a data output signal in response to the pull-up control signal UP. The second pre-driver 220 outputs a data output signal in response to the pull-down control signal DN. The first output driver 310 pull-up drives the data output pad DQ<1> in response to the output of the first pre-driver 210. The second output driver 320 pull-down drives the data output pad DQ<1> in response to the output of the second pre-driver 220.

A slew rate control unit 400 is used to control the slew rate of the driver unit. The slew rate control unit 400 determines whether the phase of data outputted through the data output pad DQ<1> is equal to the phase of adjacent data outputted through the other data output pads DQ<0> and DQ<2> adjacent to the data output pad DQ<1>, and controls the pre-drivers 210 and 220 according to the determination results. The slew rate of the pre-drivers 210 and 220 is controlled by controlling currents flowing through the output terminals of the pre-drivers 210 and 220 in response to a control signal DEC<0:1> or INC<0:1> outputted from the slew rate control unit 400, which represents the above determination results.

Figure 2:
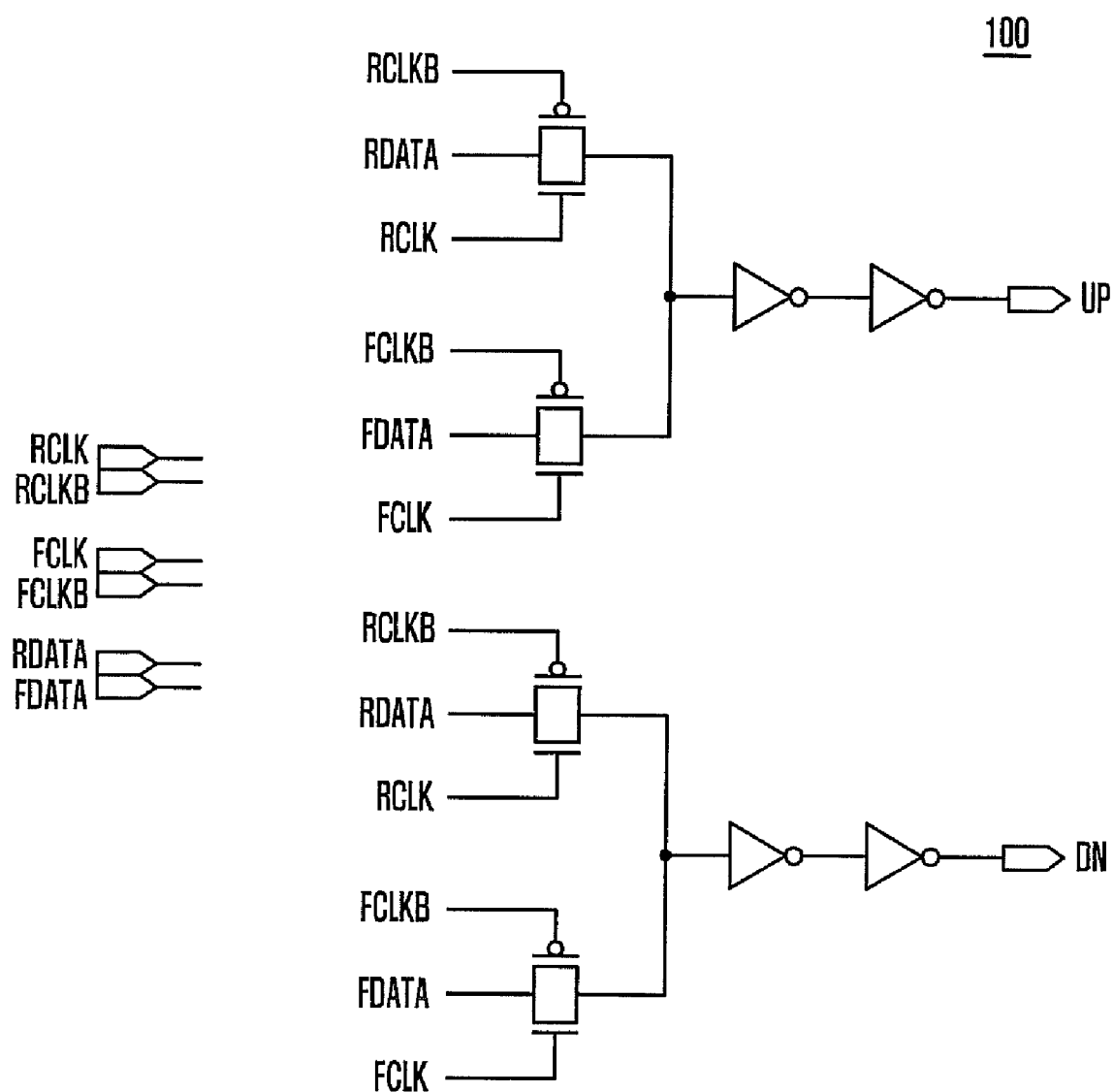
FIG. 2 is a circuit diagram illustrating an exemplary structure of a data trigger unit 100 illustrated in FIG. 1.

FIG. 2 is a circuit diagram illustrating an exemplary structure of the data trigger unit 100 illustrated in FIG. 1.

As shown, the data trigger unit 100 includes two crystal oscillators and two inverters that are triggered in response to input data to output the pull-up control signal UP. Herein, the first crystal oscillator outputs an input data RDATA in response to a high-level of signal RCLK, and the input data RDATA is output through the two inverters as the pull-up control signal UP. The second crystal oscillator outputs an input data FDATA in response to a high-level of signal FCLK, and the input data FDATA is outputted through the two inverters as the pull-up control signal UP.

Also, the data trigger unit 100 includes two crystal oscillators and two inverters that are triggered in response to the input data to output the pull-down control signal DN. Herein, the first crystal oscillator outputs an input data RDATA in response to a high-level of signal RCLK, and the input data RDATA is output through the two inverters as the pull-down signal DN. The second crystal oscillator outputs an input data FDATA in response to a high-level of signal FCLK, and the input data FDATA is output through the two inverters as the pull-down control signal DN.

It is exemplified that a clock and data inputted to the data trigger unit 100 are a clock and data in case of a DDR DRAM device. The DDR DRAM device outputs data at a rising edge of a data strobe signal DQS and outputs data at a falling edge of the data strobe signal DQS. The data RDATA is data outputted in synchronization with a rising edge of the data strobe signal DQS, and the FDATA is data outputted in synchronization with a falling edge of the data strobe signal DQS. The signals RCLK and the FCLK are strobe signals that are respectively used to read the data RDATA and FDATA in synchronization with the clock. Signals RCLKB and FCLKB are opposite in phase to the signals RCLK and FCKL, respectively. The signal FCLK comes later by a half clock than the RCLK. The pull-up control signal UP outputted from the data trigger unit 100 is applied to the first pre-driver 210, and the pull-down control signal DN is applied to the second pre-driver 220.

Figure 3:
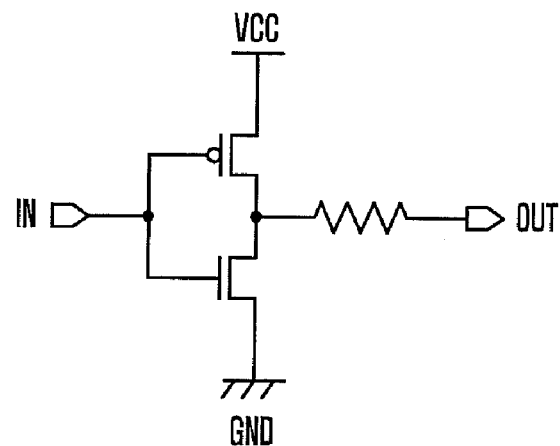
FIG. 3 is a circuit diagram illustrating an exemplary structure of a conventional pre-driver.
Figure 10:
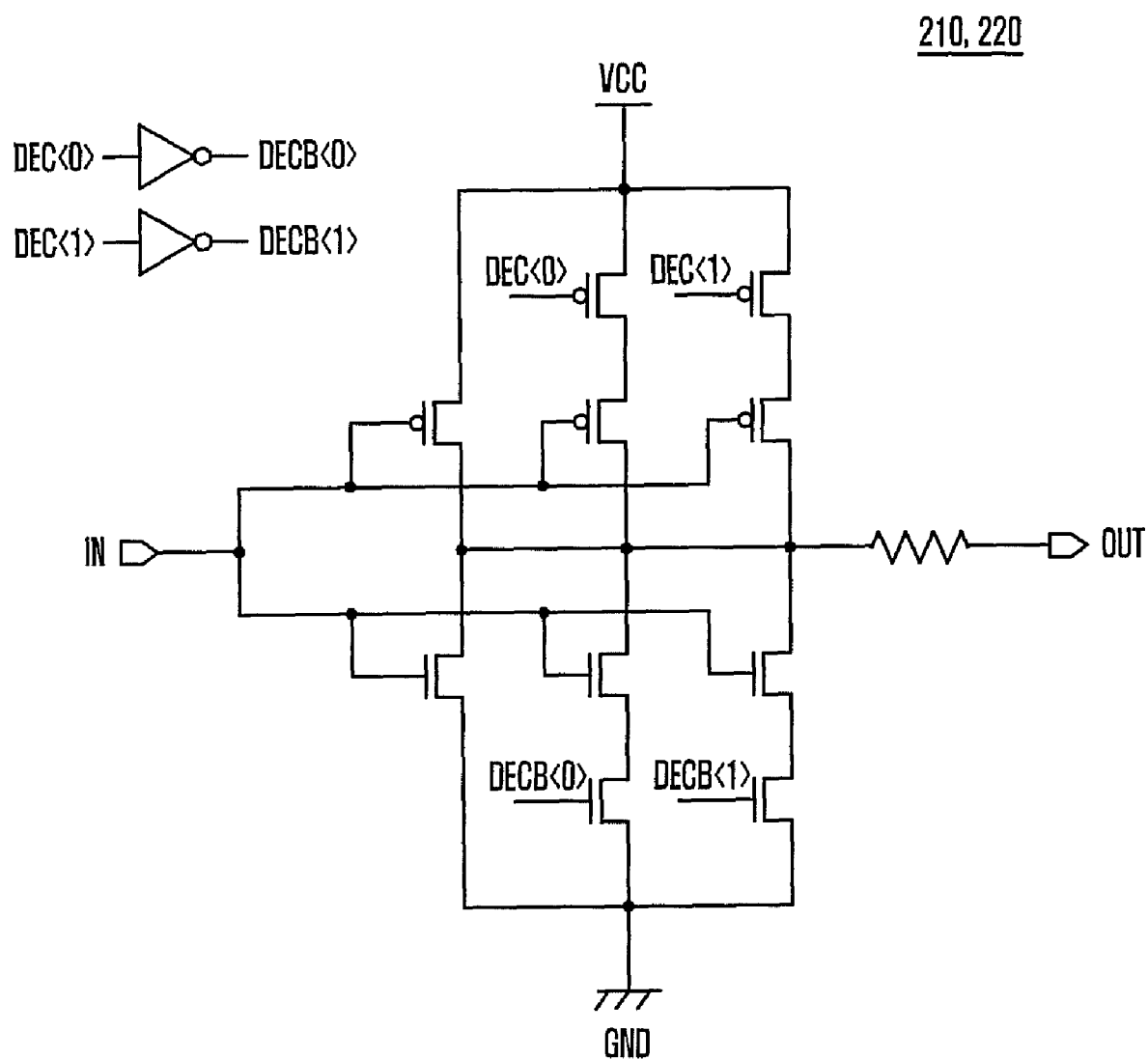
FIG. 10 is a circuit diagram illustrating an exemplary structure of pre-drivers 210 and 220 illustrated in FIG. 1.
Figure 13:
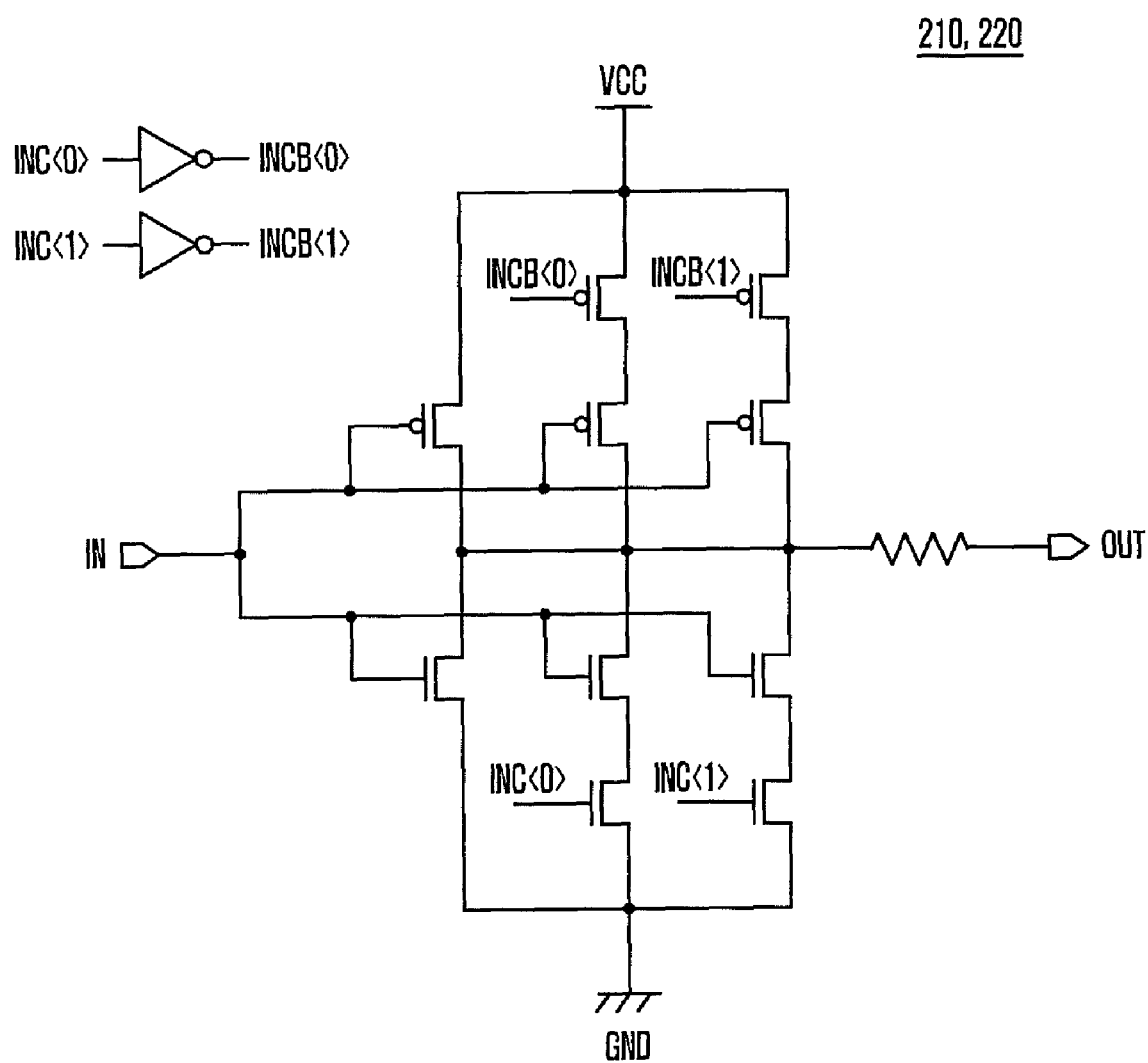
FIG. 13 is a circuit diagram illustrating another exemplary structure of the pre-drivers 210 and 220 illustrated in FIG. 1.

The first pre-driver 210 outputs a data output signal in response to the pull-up control signal UP, and the second pre-driver 220 outputs a data output signal in response to the pull-down control signal DN. The pre-drivers 210 and 220 control the slopes of signals inputted to the output drivers 310 and 320, thereby controlling the slow rates of data outputted from the output drivers 310 and 320. An exemplary conventional structure of the pre-drivers 210 and 220 is illustrated in FIG. 3. A structure of the pre-drivers 210 and 220 in accordance with an exemplary embodiment of the present invention is illustrated in FIG. 10, and a structure of the pre-drivers 210 and 220 in accordance with another exemplary embodiment of the present invention is illustrated in FIG. 13.

As illustrated in FIG. 3, the conventional pre-driver includes a resistor and a pair of a PMOS field effect transistor (FET) and an NMOS FET that are connected in series between a power source voltage terminal VCC and a ground terminal GND. On the other hand, as illustrated in FIGS. 10 and 13, the pre-driver in accordance with the embodiments of the present invention further includes other PMOS FETs and NMOS FETs connected in parallel to the components of the conventional pre-driver, in addition to the components of the conventional pre-driver.

Figure 4:
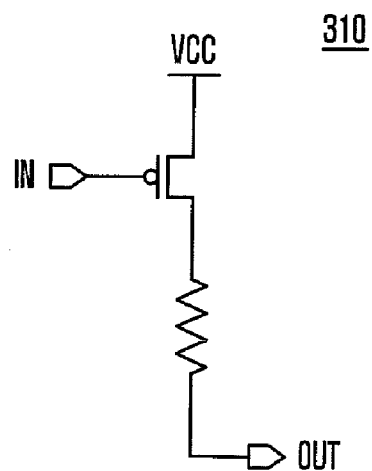
FIG. 4 is a circuit diagram illustrating an exemplary structure of an output driver 310 illustrated in FIG. 1.

FIG. 4 is a circuit diagram illustrating an exemplary structure of the output driver 310 illustrated in FIG. 1.

As shown, the first output driver 310 is configured to pull-up drive the data output pad DQ<1> in response to the output of the first pre-driver 210. The first output driver 310 has an input terminal IN connected to an output terminal of the first pre-driver 210 and an output terminal OUT connected to the data output pad DQ<1>. The first output driver 310 includes a PMOS FET and a resistor that are connected in series between a power source voltage terminal VCC and the output terminal OUT. A gate terminal of the PMOS FET is connected to the input terminal IN.

Figure 5:
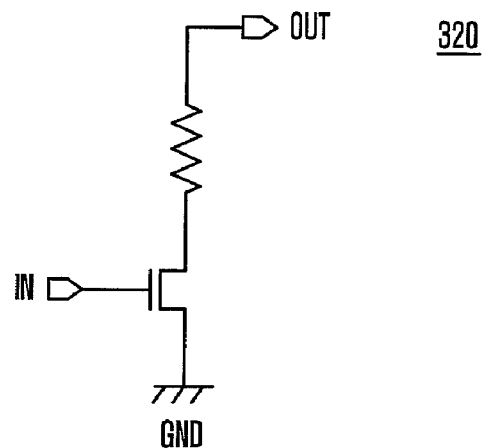
FIG. 5 is a circuit diagram illustrating an exemplary structure of an output driver 320 illustrated in FIG. 1.

FIG. 5 is a circuit diagram illustrating an exemplary structure of the second output driver 320 illustrated in FIG. 1.

As shown, the second output driver 320 is configured to pull-down drive the data output pad DQ<1> in response to the output of the second pre-driver 220. The second output driver 320 has an input terminal IN connected to an output terminal of the second pre-driver 220 and an output terminal OUT connected to the data output pad DQ<1>. The second output driver 320 includes a resistor and an NMOS FET that are connected in series between the output terminal OUT and a ground voltage terminal GND. A gate terminal of the NMOS FET is connected to the input terminal IN.

Figure 6:
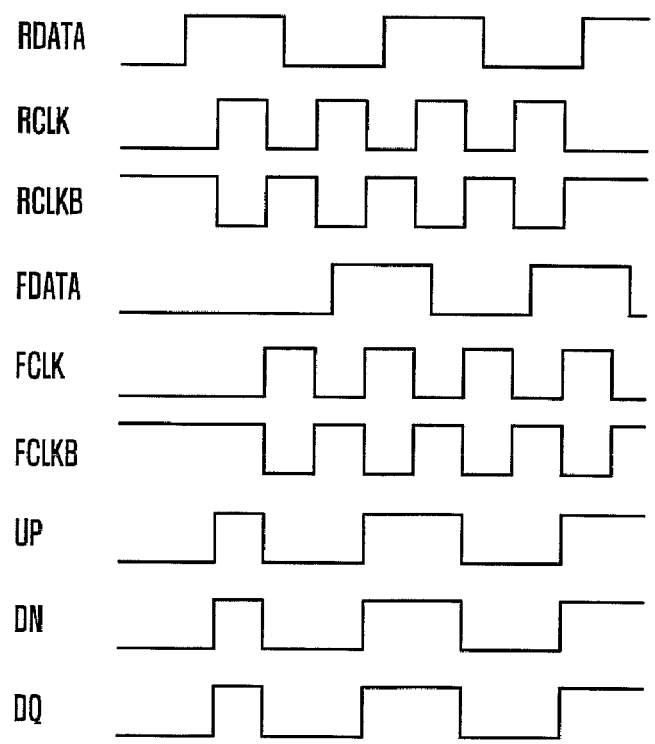
FIG. 6 is a timing diagram of a data output circuit illustrated in FIG. 1.

FIG. 6 is a timing diagram of the data output circuit illustrated in FIG. 1.

As shown, an input data RDATA is outputted in response to a high-level of signal RCLK or an input data FDATA is outputted in response to a high-level of signal FCLK, thereby outputting the pull-up control signal UP and the pull-down control signal DN. A data output pad DQ is pull-up or pull-down driven in response to the generation of the pull-up control signal UP or the pull-down control signal DN.

Figure 11:
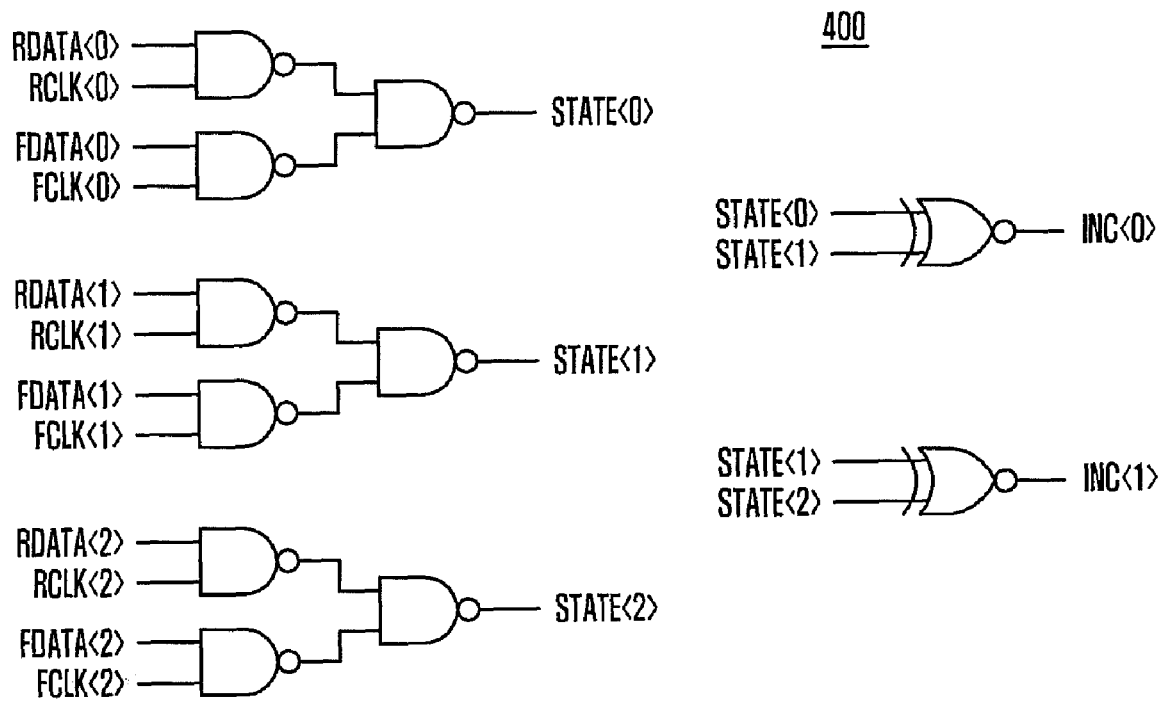
FIG. 11 is a circuit diagram illustrating another exemplary structure of the slew rate control unit 400 illustrated in FIG. 1.
Figure 12:
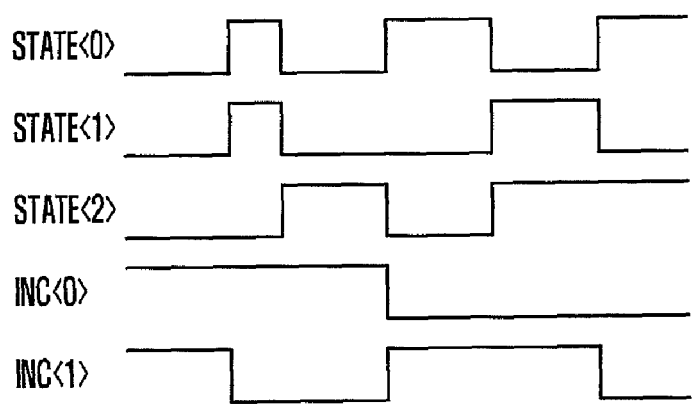
FIG. 12 is a timing diagram of a second stage of the slew rate control unit 400 illustrated in FIG. 11.

FIGS. 7 to 10 illustrate the structures of the slew rate control unit 400 and the pre-drivers 210 and 220 in accordance with Embodiment 1 of the present invention, and FIGS. 11 to 13 illustrate the structures of the slew rate control unit 400 and the pre-drivers 210 and 220 in accordance with Embodiment 2 of the present invention. In these embodiments, the slew rate control unit 400 performs an operation for compensating the slew rate of the driver unit that is degraded because output data are influenced by adjacent output data. For example, if the data output pads DQ<0>, DQ<1> and DQ<2> are disposed adjacent to each other as illustrated in FIG. 1, the slew rate of data outputted through the data output pad DQ<0> is influenced by the phase of the data output pad DQ<1> and the slew rate of data outputted through the data output pad DQ<1> is influenced by the phase of the data output pad DQ<0> and the phase of the data output pad DQ<2>. In general, the slew rate of the data outputted through the data output pad DQ<1> is higher when the phase of data is opposite to that of data outputted through the data output pads DQ<0> DQ<2>, compared to the slew rate when the data outputted through the data output pads DQ<0>, DQ<1> and DQ<2> all have the same phase. The slew rate control unit 400 in accordance with the following embodiments performs an operation of reducing the slew rate of the output data in the above case.

Embodiment 1 generates a high-level control signal when the phase of output data is different from the phase of adjacent output data. Current flowing through the pre-drivers 210 and 220 is reduced in response to the high-level control signal, thereby reducing the slew rate of the driver unit.

Figure 7:
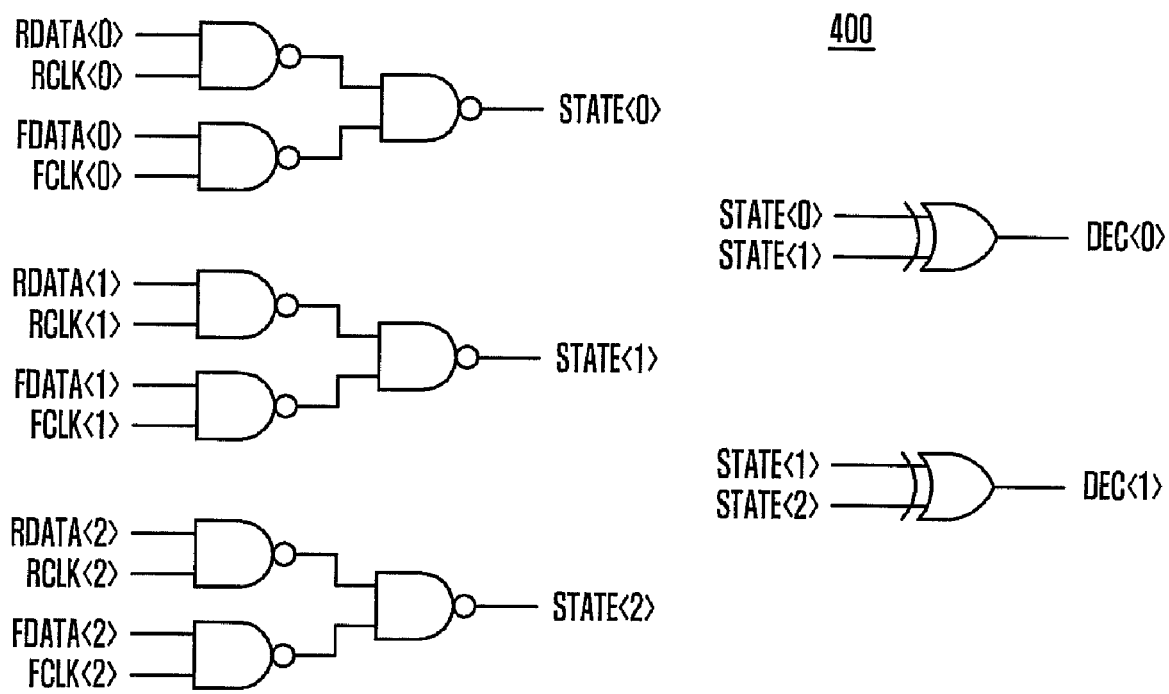
FIG. 7 is a circuit diagram illustrating an exemplary structure of a slew rate control unit 400 illustrated in FIG. 1.

FIG. 7 is a circuit diagram illustrating an exemplary structure of the slew rate control unit 400 illustrated in FIG. 1.

Referring to FIG. 7, the slew rate control unit 400 is divided into a first stage and a second state. The first stage detects the states of data outputted through the data output pads DQ<0>, DQ<1> and DQ<2>. A combination of first three NAND gates receiving RDATA<0>, RCLK<0>, FDATA<0> and FCLK<0> detects the state of adjacent data outputted through the data output pad DQ<0>, and outputs a detection result signal STATE<0>. A combination of second three NAND gates receiving RDATA<1>, RCLK<1>, FDATA<1> and FCLK<1> detects the state of data outputted through the data output pad DQ<1>, and outputs a detection result signal STATE<1>. A combination of third three NAND gates receiving RDATA<2>, RCLK<2>, FDATA<2> and FCLK<2> detects the state of adjacent data outputted through the data output pad DQ<2>, and outputs a detection result signal STATE<2>. That is, the components outputting the detection result signal STATE<1> serve as a detector capable of detecting the state of data outputted through their own data output pad DQ<1>, and the components outputting the detection result signals STATE<0> and STATE<2> serve as a detector that detects the state of adjacent data outputted through the data output pads DQ<0> and DQ<2> adjacent to the data output pad DQ<1>.

The second stage receives the outputs of the detectors to output control signals indicating whether the phase of data outputted through its own data output pad DQ<1> is equal to the phase of adjacent data outputted through the adjacent data output pads DQ<0> and DQ<2>. An upper XOR gate performs an XOR-operation on the detection result signals STATE<0> and STATE<1> to output an XOR result DEC<0>. A lower XOR gate performs an XOR-operation on the detection result signals STATE<1> and STATE<2> to output an XOR result DEC<1>. If the phase of data outputted through the data output pad DQ<1> is equal to the phase of adjacent data outputted through the adjacent data output pad DQ<0>, the upper XOR gate outputs a low-level control signal DEC<0> indicating such a fact; and if not, the upper XOR gate outputs a high-level control signal DEC<0> indicating such a fact. If the phase of data outputted through the data output pad DQ<1> is equal to the phase of adjacent data outputted through the adjacent data output pad DQ<2>, the lower XOR gate outputs a low-level control signal DEC<1> indicating such a fact; and if not, the lower XOR gate outputs a high-level control signal DEC<1> indicating such a fact.

Figure 8:
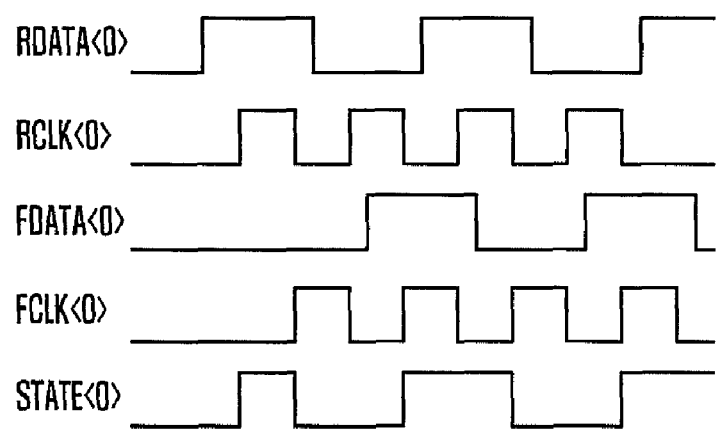
FIG. 8 is a timing diagram of a first stage of the slew rate control unit 400 illustrated in FIG. 7.
Figure 9:
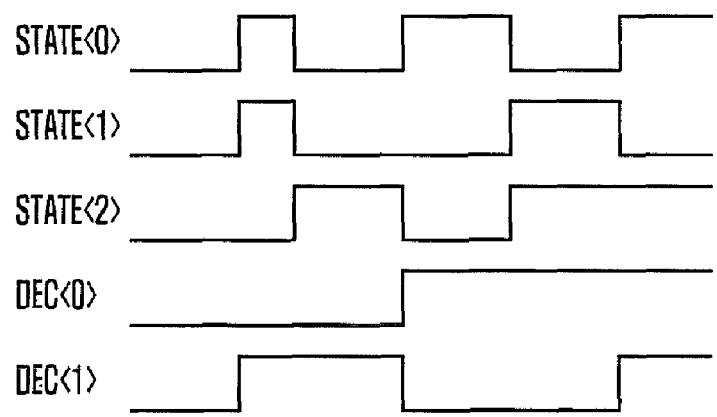
FIG. 9 is a timing diagram of a second stage of the slew rate control unit 400 illustrated in FIG. 7.

FIG. 8 is a timing diagram of the first stage of the slew rate control unit 400 illustrated in FIG. 7, and FIG. 9 is a timing diagram of the second stage of the slew rate control unit 400 illustrated in FIG. 7. FIG. 8 illustrates only an operational timing for detecting the states of the data RDATA<0> and FDATA<0> outputted through the data output pad DQ<0> and outputting the detection result as STATE<0>. However, it should be noted that an operational timing for detecting the states of data outputted through the other data output pads DQ<1> and DQ<2> and outputting the detection results as STATE<1> and STATE<2> is performed in the same way as above.

As shown, when the signal RCLK<0> is of a high level, the data RDATA<0> is outputted as the detection result signal STATE<0>, and when signal FCLK<0> is of a high level, the data FDATA<0> is outputted as the detection result signal STATE<0>. That is, the detection result signal STATE<0> is a detection signal indicating the state of data outputted through the data output pad DQ<0>. Although not illustrated in the drawings, the detection result signal STATE<1> is a detection signal indicating the state of data outputted through the data output pad DQ<1>, and the detection result signal STATE<2> is a detection signal indicating the state of data outputted through the data output pad DQ<2>.

Referring to FIG. 9, if the phase of the detection result signal STATE<0> is equal to the phase of the detection result signal STATE<1>, a low-level control signal DEC<0> is outputted; and if the phase of the detection result signal STATE<0> is different from the phase of the detection result signal STATE<1>, a high-level control signal DEC<0> is outputted. This operation is preformed by the upper XOR gate illustrated in FIG. 7. Likewise, if the phase of the detection result signal STATE<1> is equal to the phase of the detection result signal STATE<2>, a low-level control signal DEC<1> is outputted; and if the phase of the detection result signal STATE<1> is different from the phase of the detection result signal STATE<2>, a high-level control signal DEC<1> is outputted. This operation is preformed by the lower XOR gate illustrated in FIG. 7. That is, if the phase of data outputted through the data output pad DQ<1> is equal to the phase of data outputted through the adjacent data output pad DQ<0>, the XOR gates of FIG. 7 generate a low-level control signal DEC<0> indicating such a fact; and if the phase of data outputted through the data output pad DQ<1> is equal to the phase of data outputted through the adjacent data output pad DQ<2>, the XOR gates of FIG. 7 generate a low-level control signal DEC<1> indicating such a fact.

FIG. 10 is a circuit diagram illustrating an exemplary structure of the pre-drives 210 and 220 illustrated in FIG. 1.

As shown, the pre-drivers 210 and 220 receive the control signals DEC<0> and DEC<1> generated by the slew rate control unit 400. The pre-drivers 210 and 220 also receive DECB<0> and DECB<1> that are inversions of the control signals DEC<0> and DEC<1>. The pre-drivers 210 and 220 have an input terminal IN connected to the data trigger unit 100, a power source voltage terminal VCC, a ground voltage terminal GND, and an output terminal OUT connected to the output drivers 310 and 320. A pair of PMOS FET and NMOS FET are connected in series between the power source voltage terminal VCC and the ground voltage terminal GND. The PMOS FET has a gate terminal connected to the input terminal IN, a drain terminal connected through a resistor to the output terminal OUT, and a source terminal connected to the power source voltage terminal VCC. The NMOS FET has a gate terminal connected to the input terminal IN, a drain terminal connected through a resistor to the output terminal OUT, and a source terminal connected to the ground voltage terminal GND. The pair of the PMOS FET and the NMOS FET serve as a data output element that outputs a data output signal to the output terminal OUT when a pull-up control signal UP/a pull-down control signal DN is received from the data trigger unit 100 through the input terminal IN.

The pre-drivers 210 and 220 also include PMOS FETs and NMOS FETs that serve as current control elements that are connected in parallel to the pair of the PMOS FET and the NMOS FET, which are serially connected and serve as the data output element, to control the amount of a current flowing through the output terminal OUT.

The first current control element has two NMOS FETs and two PMOS FETs connected in series between the power source voltage terminal VCC and the ground voltage terminal GND. The first current control element controls a current flowing through the output terminal OUT in response to the inverted control signal DECB<0> and the control signal DEC<0> received from the slew rate control unit 400. The upper PMOS FET has a gate terminal connected to input the control signal DEC<0>, a source terminal connected to the power source voltage terminal VCC, and a drain terminal connected to a source terminal of the lower PMOS FET. The lower PMOS FET has a gate terminal connected to the input terminal IN, a source terminal connected to the drain terminal of the upper PMOS FET, and a drain terminal connected through a resistor to the output terminal OUT. The upper NMOS FET has a gate terminal connected to the input terminal IN, a drain terminal connected through a resistor to the output terminal OUT, and a source terminal connected to a drain terminal of the lower NMOS FET. The lower NMOS FET has a gate terminal connected to input the inverted control signal DECB<0>, a drain terminal connected to the source terminal of the upper NMOS FET, and a source terminal connected to the ground voltage terminal GND.

When the phase of data outputted through the data output pad DQ<1> is equal to the phase of data outputted through the adjacent data output pad DQ<0> and thus the control signal DEC<0> is of a low level, the upper PMOS FET and the lower NMOS FET are all turned on. Accordingly, an output slope and a current flowing through the pre-drivers 210 and 220 increase, thereby increasing the slew rate of the output data.

On the other hand, when the phase of data outputted through the data output pad DQ<1> is different from the phase of data outputted through the adjacent data output pad DQ<0> and thus the control signal DEC<0> is of a high level, the upper PMOS FET and the lower NMOS FET are all turned off. Accordingly, an output slope and a current flowing through the pre-drivers 210 and 220 decreases, thereby decreasing the slew rate of the output data.

The second current control element has two NMOS FETs and two PMOS FETs connected in series between the power source voltage terminal VCC and the ground voltage terminal GND. The second current control element controls a current flowing through the output terminal OUT in response to the inverted control signal DECB<1> and the control signal DEC<1> received from the slew rate control unit 400. The upper PMOS FET has a gate terminal connected to input the control signal DEC<1>, a source terminal connected to the power source voltage terminal VCC, and a drain terminal connected to a source terminal of the lower PMOS FET. The lower PMOS FET has a gate terminal connected to the input terminal IN, a source terminal connected to the drain terminal of the upper PMOS FET, and a drain terminal connected through a resistor to the output terminal OUT. The upper NMOS FET has a gate terminal connected to the input terminal IN, a drain terminal connected through a resistor to the output terminal OUT, and a source terminal connected to a drain terminal of the lower NMOS FET. The lower NMOS FET has a gate terminal connected to input the inverted control signal DECB<1>, a drain terminal connected to the source terminal of the upper NMOS FET, and a source terminal connected to the ground voltage terminal GND.

When the phase of data outputted through the data output pad DQ<1> is equal to the phase of data outputted through the adjacent data output pad DQ<2> and thus the control signal DEC<1> is of a low level, the upper PMOS FET and the lower NMOS FET are all turned on. Accordingly, an output slope and a current flowing through the pre-drivers 210 and 220 increase, thereby increasing the slew rate of the output data.

On the other hand, when the phase of data outputted through the data output pad DQ<1> is different from the phase of data outputted through the adjacent data output pad DQ<2> and thus the control signal DEC<1> is of a high level, the upper PMOS FET and the lower NMOS FET are all turned off. Accordingly, an output slope and a current flowing through the pre-drivers 210 and 220 decreases, thereby decreasing the slew rate of the output data.

Embodiment 2 generates a low-level control signal when the phase of output data is different from the phase of adjacent output data. The Embodiment 1 reduces an output slope and a current flowing through the pre-drivers 210 and 220 in response to the low-level control signal, thereby reducing the slew rate of the driver unit.

FIG. 11 is a circuit diagram illustrating another exemplary structure of the slew rate control unit 400 illustrated in FIG. 1.

As shown, the slew rate control unit 400 is divided into a first stage and a second state. The first stage detects the states of data outputted through the data output pads DQ<0>, DQ<1> and DQ<2>. A combination of first three NAND gates receiving RDATA<0>, RCLK<0>, FDATA<0> and FCLK<0> detects the state of adjacent data outputted through the data output pad DQ<0>, and outputs a detection result signal STATE<0>. A combination of second three NAND gates receiving RDATA<1>, RCLK<1>, FDATA<1> and FCLK<1> detects the state of data outputted through the data output pad DQ<1>, and outputs a detection result signal STATE<1>. A combination of third three NAND gates receiving RDATA<2>, RCLK<2>, FDATA<2> and FCLK<2> detects the state of adjacent data outputted through the data output pad DQ<2>, and outputs a detection result signal STATE<2>. That is, the components outputting the detection result signal STATE<1> serve as a detector that detects the state of data outputted through their own data output pad DQ<1>, and the components outputting the detection result signals STATE<0> and STATE<2> serve as a detector that detects the state of adjacent data outputted through the data output pads DQ<0> and DQ<2> adjacent to the data output pad DQ<1>.

The second stage receives the outputs of the detectors to output control signals indicating whether the phase of data outputted through the data output pad DQ<1> is equal to the phase of adjacent data outputted through the adjacent data output pads DQ<0> and DQ<2>. An upper XOR gate performs an XOR-operation on the detection result signals STATE<0> and STATE<1> to output an XOR result INC<0>. A lower XOR gate performs an XOR-operation on the detection result signals STATE<1> and STATE<2> to output an XOR result INC<1>. If the phase of data outputted through the data output pad DQ<1> is equal to the phase of adjacent data outputted through the adjacent data output pad DQ<0>, the upper XOR gate outputs a high-level control signal INC<0> indicating such a fact; and if not, the upper XOR gate outputs a high-level control signal INC<0> indicating such a fact. If the phase of data outputted through the data output pad DQ<1> is equal to the phase of adjacent data outputted through the adjacent data output pad DQ<2>, the lower XOR gate outputs a high-level control signal INC<1> indicating such a fact; and if not, the lower XOR gate outputs a high-level control signal INC<1> indicating such a fact.

FIG. 12 is a timing diagram of a second stage of the slew rate control unit 400 illustrated in FIG. 11. A timing diagram of the first stage of the slew rate control unit 400 is the same as that of FIG. 8, and its description will be omitted for conciseness.

As shown, if the phase of the detection result signal STATE<0> is equal to the phase of the detection result signal STATE<1>, a high-level control signal INC<0> is outputted; and if the phase of the detection result signal STATE<0> is different from the phase of the detection result signal STATE<1>, a low-level control signal INC<0> is outputted. This operation is preformed by the upper XOR gate illustrated in FIG. 11. Likewise, if the phase of the detection result signal STATE<1> is equal to the phase of the detection result signal STATE<2>, a high-level control signal INC<1> is outputted; and if the phase of the detection result signal STATE<1> is different from the phase of the detection result signal STATE<2>, a low-level control signal INC<1> is outputted. This operation is preformed by the lower XOR gate illustrated in FIG. 11. That is, if the phase of data outputted through the data output pad DQ<1> is equal to the phase of data outputted through the adjacent data output pad DQ<0>, the XOR gates of FIG. 11 generate a high-level control signal INC<0> indicating such a fact; and if the phase of data outputted through the data output pad DQ<1> is equal to the phase of data outputted through the adjacent data output pad DQ<2>, the XOR gates of FIG. 11 generate a high-level control signal INC<1> indicating such a fact.

FIG. 13 is a circuit diagram illustrating another exemplary structure of the pre-drivers 210 and 220 illustrated in FIG. 1.

Referring to FIG. 13, the pre-drivers 210 and 220 receive the control signals INC<0> and INC<1> generated by the slew rate control unit 400. The pre-drivers 210 and 220 also receive INCB<0> and INCB<1> that are inversions of the control signals INC<0> and INC<1>. The pre-drivers 210 and 220 have an input terminal IN connected to the data trigger unit 100, a power source voltage terminal VCC, a ground voltage terminal GND, and an output terminal OUT connected to the output drivers 310 and 320. A pair of PMOS FET and NMOS FET are connected in series between the power source voltage terminal VCC and the ground voltage terminal GND. The PMOS FET has a gate terminal connected to the input terminal IN, a drain terminal connected through a resistor to the output terminal OUT, and a source terminal connected to the power source voltage terminal VCC. The NMOS FET has a gate terminal connected to the input terminal IN, a drain terminal connected through a resistor to the output terminal OUT, and a source terminal connected to the ground voltage terminal GND. The pair of the PMOS FET and the NMOS FET serves as a data output element that outputs a data output signal to the output terminal OUT when a pull-up control signal UP/a pull-down control signal DN is received from the data trigger unit 100 through the input terminal IN.

The pre-drivers 210 and 220 also include PMOS FETs and NMOS FETs that serve as current control elements that are connected in parallel to the pair of the PMOS FET and the NMOS FET, which are serially connected and serve as the data output element, to control the amount of a current flowing through the output terminal OUT.

The first current control element has two NMOS FETs and two PMOS FETs connected in series between the power source voltage terminal VCC and the ground voltage terminal GND. The first current control element controls a current flowing through the output terminal OUT in response to the inverted control signal INCB<0> and the control signal INC<0> received from the slew rate control unit 400. The upper PMOS FET has a gate terminal connected to input the inverted control signal INCB<0>, a source terminal connected to the power source voltage terminal VCC, and a drain terminal connected to a source terminal of the lower PMOS FET. The lower PMOS FET has a gate terminal connected to the input terminal IN, a source terminal connected to the drain terminal of the upper PMOS FET, and a drain terminal connected through a resistor to the output terminal OUT. The upper NMOS FET has a gate terminal connected to the input terminal IN, a drain terminal connected through a resistor to the output terminal OUT, and a source terminal connected to a drain terminal of the lower NMOS FET. The lower NMOS FET has a gate terminal connected to input the control signal INC<0>, a drain terminal connected to the source terminal of the upper NMOS FET, and a source terminal connected to the ground voltage terminal GND.

When the phase of data outputted through the data output pad DQ<1> is equal to the phase of data outputted through the adjacent data output pad DQ<0> and thus the control signal INC<0> is of a high level, the upper PMOS FET and the lower NMOS FET are all turned on. Accordingly, an output slope and a current flowing through the pre-drivers 210 and 220 increase, thereby increasing the slew rate of the output data.

On the other hand, when the phase of data outputted through the data output pad DQ<1> is different from the phase of data outputted through the adjacent data output pad DQ<0> and thus the control signal INC<0> is of a low level, the upper PMOS FET and the lower NMOS FET are all turned off. Accordingly, an output slope and a current flowing through the pre-drivers 210 and 220 decreases, thereby decreasing the slew rate of the output data.

The second current control element has two NMOS FETs and two PMOS FETs connected in series between the power source voltage terminal VCC and the ground voltage terminal GND. The second current control element controls a current flowing through the output terminal OUT in response to the inverted control signal INCB<1> and the control signal INC<1> received from the slew rate control unit 400. The upper PMOS FET has a gate terminal connected to input the inverted control signal INCB<1>, a source terminal connected to the power source voltage terminal VCC, and a drain terminal connected to a source terminal of the lower PMOS FET. The lower PMOS FET has a gate terminal connected to the input terminal IN, a source terminal connected to the drain terminal of the upper PMOS FET, and a drain terminal connected through a resistor to the output terminal OUT. The upper NMOS FET has a gate terminal connected to the input terminal IN, a drain terminal connected through a resistor to the output terminal OUT, and a source terminal connected to a drain terminal of the lower NMOS FET. The lower NMOS FET has a gate terminal connected to input the control signal INC<1>, a drain terminal connected to the source terminal of the upper NMOS FET, and a source terminal connected to the ground voltage terminal GND.

When the phase of data outputted through the data output pad DQ<1> is equal to the phase of data outputted through the adjacent data output pad DQ<2> and thus the control signal INC<1> is of a high level, the upper PMOS FET and the lower NMOS FET are all turned on. Accordingly, an output slope and a current flowing through the pre-drivers 210 and 220 increase, thereby increasing the slew rate of the output data.

On the other hand, when the phase of data outputted through the data output pad DQ<1> is different from the phase of data outputted through the adjacent data output pad DQ<2> and thus the control signal INC<1> is of a low level, the upper PMOS FET and the lower NMOS FET are all turned off. Accordingly, an output slope and a current flowing through the pre-drivers 210 and 220 decreases, thereby decreasing the slew rate of the output data.

As described above, the present invention compensates the slew rate of the driver unit in consideration of the fact that the slew rate of data outputted through the data output pad is influenced by the phase of data outputted through the adjacent data output pads because the data output pads of the data output circuit of the semiconductor memory device are disposed adjacent to each other. That is, when the phase of data outputted through the data output pad is equal to the phase of data outputted through the adjacent data output pads and thus the slew rate of the driver unit decreases, the present invention increases the current flowing through the pre-driver, thereby increasing the slew rate of the driver unit. On the other hand, when the phase of data outputted through the data output pad is different from the phase of data outputted through the adjacent data output pads and thus the slew rate of the driver unit increases, the present invention decreases the current flowing through the pre-driver, thereby decreasing the slew rate of the driver unit.

As described above, the present invention can compensate the slew rate of the driver unit by increasing/decreasing the current flowing through the pre-driver in consideration of the fact that the slew rate of data outputted through the data output pad is influenced by the phase of data outputted through the adjacent data output pads because the data output pads of the data output circuit of the semiconductor memory device are disposed adjacent to each other.

While the present invention has been described with respect to the specific embodiments, it will be apparent to those skilled in the art that various changes and modifications may be made without departing from the spirit and scope of the invention as defined in the following claims.

For example, although the above embodiments have been described in terms of the case where the present invention is applied to a DDR DRAM device as illustrated in FIG. 1, the present invention can also be similarly applied to any semiconductor memory device that has a data output circuit in which data output pads are disposed adjacent to each other. Although the above embodiments have been described in terms of the case where an operation of controlling the slew rate according to whether the phase of output data is equal to the phase of adjacent output data is performed by at least one FET that is turned on/off in response to the control signal, the present invention can also be implemented by any element that can control the current flowing through the output terminal of the pre-driver in response to the control signal.

What is claimed is:

1. A data output circuit of a semiconductor memory device, comprising:
    at least two data output pads disposed adjacent to each other;
    a driver unit configured to output a first data by driving a first pad among the data output pads; and
    a control unit configured to determine whether a phase of the first data is equal to a phase of adjacent data outputted through a second pad adjacent to the first pad, and control a slew rate of the driver unit according to the determination result.

2. The data output circuit of claim 1, wherein the driver unit includes:
    a data trigger unit configured to trigger the first data;
    a pre-driver configured to output a data output signal in response to the triggering of the first data; and
    an output driver configured to driver the first pad in response to the data output signal,
    wherein the control unit controls the slew rate by controlling a current flowing through an output terminal of the pre-driver in response to a control signal indicating the determination result.

3. The data output circuit of claim 2, wherein the pre-driver includes:
    an input terminal connected to the data trigger unit;
    an output terminal connected to the output driver;
    a data output element configured to output the data output signal to the output terminal in response to the triggering of the first data; and
    a current control element connected in parallel to the data output element to control a current flowing through the output terminal in response to the control signal.

4. The data output circuit of claim 3, wherein,
    the control unit is configured to output the control signal of a first level when the phase of the first data is equal to the phase of the adjacent data, and output the control signal of a second level opposite to the first level when the phase of the first data is different from the phase of the adjacent data; and
    the current control element is configured to increase the amount of a current flowing through the output terminal in response to the control signal of the first level, and decrease the amount of a current flowing through the output terminal in response to the control signal of the second level.

5. The data output circuit of claim 3, wherein the control unit includes:
    a first detector configured to detect the first data;
    a second detector configured to detect the adjacent data; and
    a control signal generator configured to output the control signal of a first level when the phase of the first data detected by the first detector is equal to the phase of the adjacent data detected by the second detector, and output the control signal of a second level opposite to the first level when the phase of the first data is different from the phase of the adjacent data,
    wherein the current control element is configured to increase the amount of a current flowing through the output terminal in response to the control signal of the first level, and decrease the amount of a current flowing through the output terminal in response to the control signal of the second level.

6. The data output circuit of claim 4, wherein the current control element includes:
    at least one field effect transistor connected in parallel to the data output element and configured to be turned on/off in response to the control signal.

7. The data output circuit of claim 6, wherein the current control element includes:
    a first PMOS field effect transistor connected to a power source voltage terminal and configured to be turned on in response to the control signal of the first level;

a second PMOS field effect transistor connected between the first PMOS field effect transistor and the output terminal and configured to operate in response to the triggering of the first data;

a first NMOS field effect transistor connected to the output terminal; and a second NMOS field effect transistor connected between the first NMOS field effect transistor and a ground voltage terminal and configured to be turned off in response to the control signal of the first level.

8. A data output circuit of a semiconductor memory device, comprising:

at least two data output pads disposed adjacent to each other;

a data trigger unit triggered in response to first data, which is to be outputted through a first pad among the data output pads, to output a pull-up control signal or a pull-down control signal;

a first pre-driver configured to output a first data output signal in response to the pull-up control signal;

a second pre-driver configured to output a second data output signal in response to the pull-down control signal;

a first output driver configured to pull-up drive the first pad in response to the first data output signal;

a second output driver configured to pull-down drive the first pad in response to the second data output signal; and a control unit configured to determine whether the phase of the first data is equal to the phase of adjacent data outputted through second pad adjacent to the first pad, and control a slew rate of the drivers according to the determination result.

9. The data output circuit of claim 8, wherein the control unit is configured to control the slew rate by controlling a current flowing through an output terminal of the first and second pre-drivers in response to a control signal indicating the determination result.

10. The data output circuit of claim 9, wherein the pre-drivers each includes:

an input terminal connected to the data trigger unit;

an output terminal connected to the corresponding output driver;

a data output element configured to output the data output signal to the output terminal in response to the pull-up/down control signal; and a current control element connected in parallel to the data output element to control a current flowing through the output terminal in response to the control signal.

11. The data output circuit of claim 9, wherein, the control unit is configured to output the control signal of a first level when the phase of the first data is equal to the phase of the adjacent data, and output the control signal of a second level opposite to the first level when the phase of the first data is different from the phase of the adjacent data; and the current control element is configured to increase the amount of a current flowing through the output terminal in response to the control signal of the first level, and decrease the amount of a current flowing through the output terminal in response to the control signal of the second level.

12. The data output circuit of claim 9, wherein the control unit includes:

a first detector configured to detect the first data;

a second detector configured to detect the adjacent data; and a control signal generator configured to output the control signal of a first level when the phase of the first data detected by the first detector is equal to the phase of the adjacent data detected by the second detector, and output the control signal of a second level opposite to the first level when the phase of the first data is different from the phase of the adjacent data, wherein the current control element is configured to increase the amount of a current flowing through the output terminal in response to the control signal of the first level, and decrease the amount of a current flowing through the output terminal in response to the control signal of the second level.

13. The data output circuit of claim 11, wherein the current control element includes:

at least one field effect transistor connected in parallel to the data output element and configured to be turned on/off in response to the control signal.

14. The data output circuit of claim 13, wherein the current control element includes:

a first PMOS field effect transistor connected to a power source voltage terminal and configured to be turned on in response to the control signal of the first level;

a second PMOS field effect transistor connected between the first PMOS field effect transistor and the output terminal and configured to operate in response to the pull-up/down control signal;

a first NMOS field effect transistor connected to the output terminal; and a second NMOS field effect transistor connected between the first NMOS field effect transistor and a ground voltage terminal and configured to be turned off in response to the control signal of the first level.

15. A method for controlling a data output circuit of a semiconductor memory device including at least two data output pads disposed adjacent to each other, the method comprising:

determining whether the phase of the first data outputted through a first pad among the data output pads is equal to the phase of adjacent data outputted through second pad adjacent to the first pad; and controlling a slew rate of a driver unit, which output the first data by driving the first pad, according to the determination result.

16. The method of claim 15, wherein the driver unit includes:

a data trigger unit configured to trigger the first data;

a pre-driver configured to output a data output signal in response to the triggering of the first data; and an output driver configured to drive the first pad in response to the output of the pre-driver 17. The method of claim 16, wherein controlling the slew rate is performed by controlling a current flowing through an output terminal of the pre-driver in response to a control signal indicating the determination result.

18. The method of claim 17, wherein controlling the slew rate includes:

outputting the control signal of a first level when the phase of the first data is equal to the phase of the adjacent data;

outputting the control signal of a second level opposite to the first level when the phase of the first data is different from the phase of the adjacent data;

increasing the amount of a current flowing through the output terminal in response to the control signal of the first level; and decreasing the amount of a current flowing through the output terminal in response to the control signal of the second level.

19. The method of claim 17, wherein increasing/decreasing the amount of a current flowing through the output terminal are performed by at least one field effect transistor turned on/off in response to the control signal.

20. The method of claim 15, wherein the driver unit includes:
- a data trigger unit triggered in response to the first data, to output a pull-up control signal or a pull-down control signal;
- a first pre-driver configured to output a data output signal in response to the pull-up control signal;
- a second pre-driver configured to output a data output signal in response to the pull-down control signal;
- a first output driver configured to pull-up drive the first pad in response to the output of the first pre-driver; and
- a second output driver configured to pull-down drive the first pad in response to the output of the second pre-driver.

21. The method of claim 20, wherein controlling the slew rate is performed by controlling a current flowing through an output terminal of the pre-driver in response to a control signal indicating the determination result.

22. The method of claim 21, wherein controlling the slew rate includes:
- outputting the control signal of a first level when the phase of the first data is equal to the phase of the adjacent data;
- outputting the control signal of a second level opposite to the first level when the phase of the first data is different from the phase of the adjacent data;
- increasing the amount of a current flowing through the output terminal of the pre-driver in response to the control signal of the first level; and
- decreasing the amount of a current flowing through the output terminal of the pre-driver in response to the control signal of the second level.

* * * * *